United States Patent [19]

Seno et al.

[11] Patent Number: 4,794,689

[45] Date of Patent: Jan. 3, 1989

[54] METHOD OF AND APPARATUS FOR MOUNTING ELECTRIC COMPONENTS

[75] Inventors: Makito Seno, Hirakata; Yoshihiko Misawa, Katano; Tsutomu Inukai, Kofu, all of Japan

[73] Assignee: Matsushita Electric Industrial Co., Ltd., Osaka, Japan

[21] Appl. No.: 929,807

[22] Filed: Nov. 13, 1986

[30] Foreign Application Priority Data

Nov. 14, 1985 [JP] Japan .................. 60-255356

[51] Int. Cl.⁴ ............................ H05K 13/04
[52] U.S. Cl. ...................... 29/740; 29/705; 29/743; 29/834
[58] Field of Search .............. 29/705, 740, 741, 743, 29/834

[56] References Cited

U.S. PATENT DOCUMENTS

| | | | |
|---|---|---|---|
| 3,956,629 | 5/1976 | Gomm et al. | 250/223 R |
| 4,458,412 | 7/1984 | Dean et al. | 29/705 |
| 4,515,479 | 5/1985 | Pryor | 250/561 |
| 4,515,507 | 5/1985 | Asai et al. | 29/740 X |
| 4,520,557 | 6/1985 | Hariyame et al. | 29/740 |
| 4,521,112 | 6/1985 | Kuwabara et al. | 356/387 |
| 4,624,050 | 11/1986 | Hawkswell | 29/740 |
| 4,631,816 | 12/1986 | Fujita et al. | 29/740 |
| 4,653,664 | 3/1987 | Hineno et al. | 29/740 X |
| 4,706,379 | 11/1987 | Seno et al. | 29/740 |

Primary Examiner—P. W. Echols
Assistant Examiner—Taylor Ross
Attorney, Agent, or Firm—Wenderoth, Lind & Ponack

[57] ABSTRACT

A component mounting method, and an apparatus therefor, which includes the steps of causing a plurality of suction nozzles, supported for intermittent movement along a predetermined path in synchronism with each other, to receive electric components at a component receiving station and then to transport them towards a component mounting station, and effecting both the rectification of the position of each component in two directions perpendicular to each other and the angle adjustment of the respective component during the successive transportation of the components towards the component mounting station. Both the rectification of the position and the angle adjustment of each component are carried out while the associated suction nozzle is held still at a certain station, and electric characteristics of each component are checked during the rectification.

7 Claims, 16 Drawing Sheets

METHOD OF AND APPARATUS FOR MOUNTING ELECTRIC COMPONENTS

CROSS REFERENCE TO RELATED APPLICATION

This application is related to U.S. patent application Ser. No. 771,765, filed Sept. 3, 1985 and assigned to the same assignee now U.S. Pat. No. 4,706,379.

BACKGROUND OF THE INVENTION

1. Field of Technology

The present invention relates to a method of and an apparatus for mounting minute electric and/or electronic components on an electric circuit wiring board such as a printed circuit board.

2. Description of the Prior Art

When minute leadless electric components such as exemplified by chip capacitors and chip resistors are to be mounted on a printed circuit board, it has long been practiced to apply a bonding agent to specific portions of the printed circuit board and then to successively supply the electric components onto the printed circuit board so that they can be bonded to the specific portions of the printed circuit board. The printed circuit board having the electric components mounted thereon is subsequently provided with external wirings for electrical connection by the use of a soldering technique.

A component mounting apparatus capable of performing the above described method has been proposed, which comprises a component mounting head capable of undergoing an indexed rotation and including a plurality of suction nozzles each operable to receive and hold under suction one of the electric components, which have been successively supplied at a component receiving station, and then to transport it to a component mounting station for the mounting onto the printed circuit board.

The component mounting apparatus of the type referred to above is schematically illustrated in FIGS. 23 to 26, reference to which will now be made for the detailed discussion thereof. In FIG. 23, reference numeral 300 designates the path along which each suction nozzle 312 (FIG. 25) undergoes a circular movement. Positions at which the suction nozzle 312 is brought to a halt include, with an exception, a component receiving station, a small component rectifying station, a big component rectifying station, a component inspecting station, a component mounting station, and a defective component rejecting station. At each of the big and small component rectifying stations, there is disposed a turntable 313, as shown in FIG. 25, where the centering of the electric component relative to the suction nozzle 312 and the adjustment of the angle of the electric component are carried out. More specifically, the turntable 313 has two pairs of rectifying fingers 314 and 315 mounted atop the turntable 313 for movement in a direction towards and away from each other, the direction of movement of the rectifying fingers 314 of one pair being perpendicular to that of the rectifying fingers 315 of the other pair. The electric component carried under suction by the suction nozzle 312 is rectified in position in two directions by the pairs of the rectifying fingers 314 and 315 while sandwiched between the rectifying fingers of the respective pair and the angle thereof is subsequently adjusted by causing the turntable 313 to be rotated by a drive belt 316. Change of the component mounting station at which the electric component is mounted on the printed circuit board is achieved by moving the printed circuit board.

While the mounting of the electric components is carried out in the manner as hereinabove described, it has been found difficult to cause the apparatus to have a checking function (hereinafter referred to as a verifier) for checking electric characteristics of each electric component, because the rectification of the position of the electric component and the angle adjustment of the same electric component are performed at one and the same station. This is because, as shown in FIG. 26, the suction nozzle 312 is fixed whereas the rectifying fingers undergo rotation while holding the electric component 8, and therefore, stable contact cannot be obtained between electrodes 317 of the electric component 8 and the adjacent rectifying fingers 314, making it impractical to provide an accurate characteristic checking. In order to stabilize the contact between the electrodes 317 and the adjacent rectifying fingers 314, a relatively long time is required, posing a problem in that the tact time in the production line tends to be prolonged.

Moreover, the verifier hitherto used is of a design wherein the electrodes are sandwiched from two directions while sucked onto the suction nozzle, and therefore, depending on the suction posture, an exact contact with the electrodes does not always take place.

SUMMARY OF THE INVENTION

The present invention is intended to provide an improved method of and an improved apparatus for mounting electric components on an electric circuit wiring board, which are capable of checking characteristics of each electric component in a stable manner without incurring a prolonged tact time in the production line.

The component mounting method according to the present invention comprises the steps of causing a plurality of suction nozzles, supported for intermittent movement along a predetermined path in synchronism with each other, to receive electric components at a component receiving station and then to transport them towards a component mounting station, and effecting both the rectification of the position of each component in two directions perpendicular to each other and the angle adjustment of the respective component during the successive transportation of the components towards the component mounting station. This component mounting method is characterized in that both the rectification of the position and the angle adjustment of each component are carried out while the associated suction nozzle is held still at a certain station and, during the rectification, electric characteristics of each component are checked.

The component mounting apparatus according to the present invention comprises a rotary framework supported for intermittent rotation and capable of being brought to a halt at any one of component receiving and mounting stations during each complete rotation thereof, said rotary framework having a plurality of suction nozzles mounted thereon for supporting respective components under suction; two pairs of rectifying fingers arranged at a position between the component receiving and mounting stations and at which the rotary framework being rotated can be brought to a halt, said rectifying fingers of each pair being movable between closed and opened positions while the rectifying fingers of the respective pairs are movable in respective directions perpendicular to each other, said rectifying fingers of all pairs being operable to rectify the position of each component, sucked by the respective suction nozzle, when moved to the closed positions, said rectifying fingers having a function of measuring elements of a verifier and also a function of detecting the presence or absence of the component; a nozzle rotating device disposed at a position between the rectifying fingers and the component mounting station and at which the rotary framework being rotated can be brought to a halt, said nozzle rotating device being operable to rotate each suction nozzle about a longitudinal axis thereof for adjusting the angle of the respective component; and a detector for detecting the attitude in which each component is retained by the respective suction nozzle.

BRIEF DESCRIPTION OF THE DRAWINGS

These and other objects and features of the present invention will become clear from the detailed description thereof taken in conjunction with the accompanying drawings, in which.

DETAILED DESCRIPTION OF THE EMBODIMENT

Figure 1:
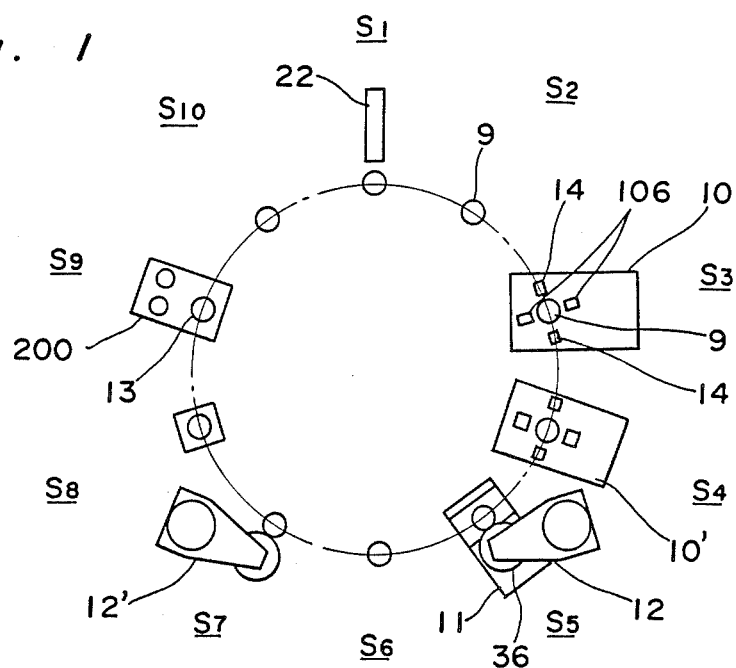
FIG. 1 is a schematic diagram showing the layout of a component mounting apparatus embodying the present invention.
Figure 2A:
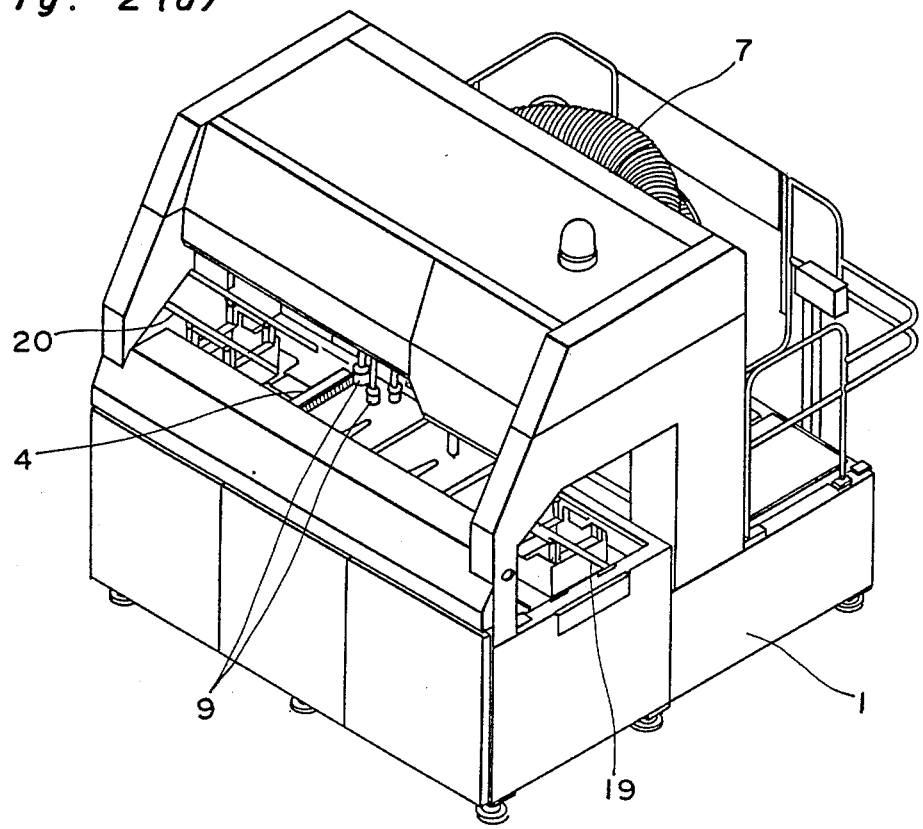
FIG. 2(A) is a perspective view of the component mounting apparatus.
Figure 2B:
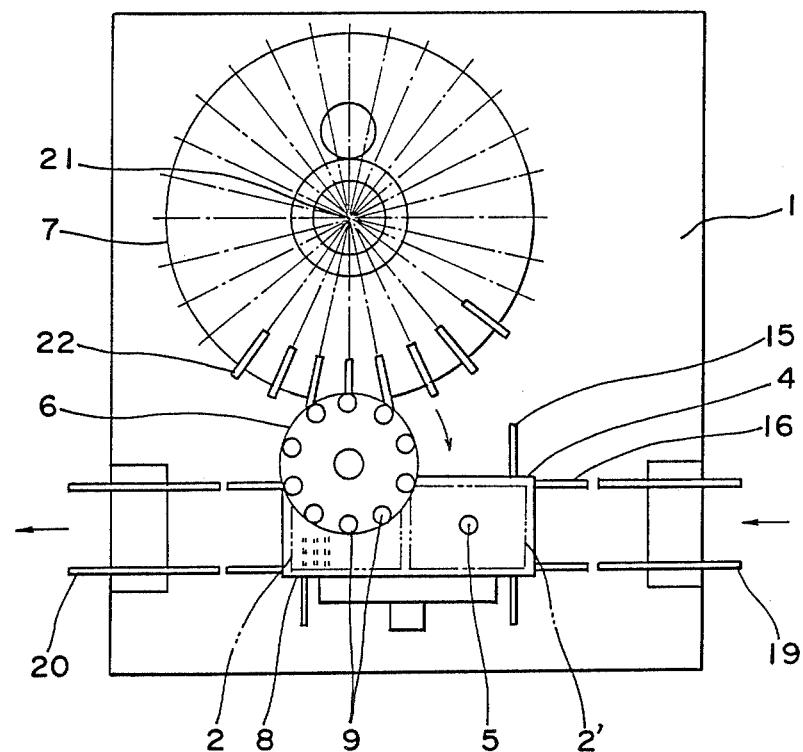
FIG. 2(B) is a schematic top plan view of the component mounting apparatus.
Figure 3:
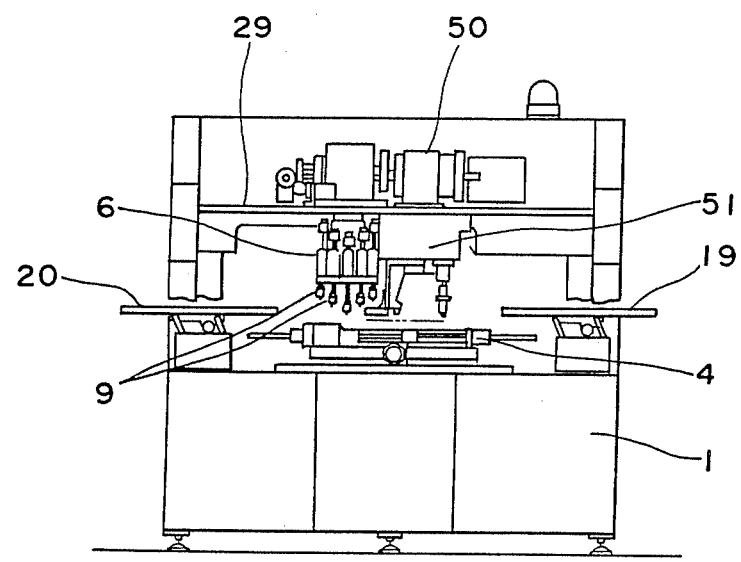
FIGS. 3 and 4 are front and side elevational views, respectively of the apparatus of FIGS. 2A and 2B.
Figure 4:
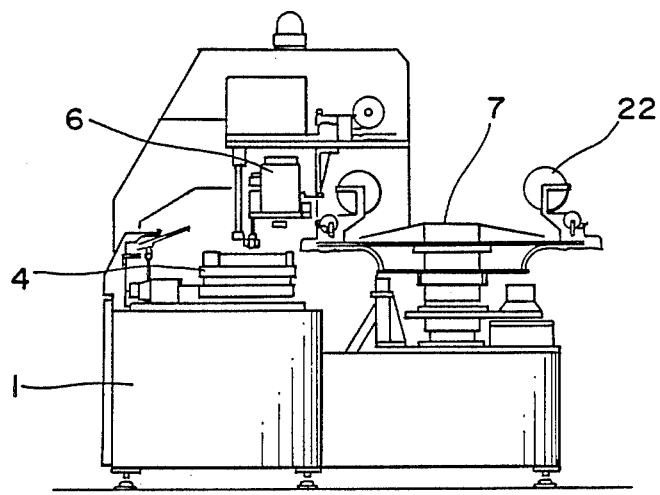

Referring now to FIGS. 1 to 23, reference numeral 1 designates a machine base having an X-Y table assembly 4 mounted at the front thereof for the support thereon of two circuit wiring boards 2 and 2' on left-hand and right-hand sides as viewed in these figures. The machine base 1 also has a bond applicator 5 for applying a bonding agent to the right-hand circuit wiring board 2' and a component mounting head 6 for mounting electric and/or electronic components 8 onto the left-hand circuit wiring board 2, both disposed thereon. A component supply rotor 7 is disposed rearwardly of the component mounting head 6. The component mounting head 6 includes a plurality of, for example, ten, suction nozzles 9 disposed in equally spaced relationship with respect to each other in a direction circumferentially thereof, said component mounting head 6 being intermittently rotatable a distance equal to the pitch between each pair of neighboring suction nozzles 9 about a vertical axis. The machine base 1 also has a head frame 29 on which a top drive unit 50 for driving various component parts of the apparatus and a head drive cam unit 51 are mounted.

The X-Y table assembly 4 is movable in X-axis and Y-axis directions perpendicular to each other, that is, in a direction leftward and rightward and also in a direction frontward and rearward, and comprises a Y-table 4a (FIG. 5) mounted on guide rails 15, extending in a direction frontwards and rearwards, for movement therealong in the Y-axis direction, and an X-table 4b mounted on transverse guide rails 16 (FIG. 3), mounted on the Y-table 4a, for movement therealong in the X-axis direction. The Y-table 4a and the X-table 4b are motor-driven by respective motors 17 and 18 by way of associated screw feeders (not shown). Acceleration during the movement of the X-Y table assembly and also at the time it is to be brought to a halt can be variable in order to avoid any possible displacement of the component under the influence of an inertia force. On respective sides of the X-Y table assembly 4, there are disposed take-in guide rails 19 and take-out guide rails 20 for the circuit wiring boards 2 and 2', respectively.

It is to be noted that the X-table 4b serves to hold a pair of opposite edges of the circuit wiring boards 2 and 2' and has built therein support pins (not shown) for supporting the circuit wiring boards 2 and 2' from a rear side thereof to avoid any possible slack thereof. The support pins are movable by, for example, a stepper motor to any one of positions in the X-axis and Y-axis directions.

The component supply rotor 7 is mounted for rotation about a vertical shaft 21 and has a plurality of component supply cassettes 22 removably mounted thereon. Each component supply cassette 22 is of a construction wherein a length of carrier tape 23 (FIG. 6) having a row of electronic components 8 retained therein is wound on a reel, and is so designed as to intermittently feed the carrier tape 23 onto a delivery unit 22a through a distance corresponding to the pitch between the neighboring components. The component supply cassettes 22 accommodate different types of electronic components 8.

The positions S1 to S10 at which the suction nozzles of the component mounting head 6 are brought to a halt during the intermittent rotation of the head includes a component receiving station S1, a big component rectifying and verifying station S3, and a small component rectifying and verifying station S4, there being carried out at these stations the detection of the presence or absence of the component. They also include a detecting and rotating station S5 at which the attitude of each component is detected and each suction nozzle is rotated, a component mounting station S6, a reversing station S7 at which each suction nozzle 9 is rotated in the opposite direction, a rejecting station S8 at which defective components are rejected, and a nozzle exchanging station S9 at which large and small nozzles are exchanged.

At the component rectifying stations S3 and S4, component rectifying units 10 and 10' each having a rectifying finger assembly 14 which concurrently serves as a measuring element for a verifier are arranged; at the detecting and rotating station S5, an attitude detecting unit 11 and a nozzle drive unit 12 are arranged; at the reversing station S7, a nozzle reversing unit 12' is arranged; at the rejecting station S8, a component recovery box 196 is disposed; and at the nozzle exchange station S9, a nozzle switching unit 200 is disposed. The positions S2 and S10 are a chuck position detecting station where detection is made to determine if a chuck has been returned to the original position and, for this purpose, sensors 97 and 98 (FIG. 8) are provided.

Figure 5:
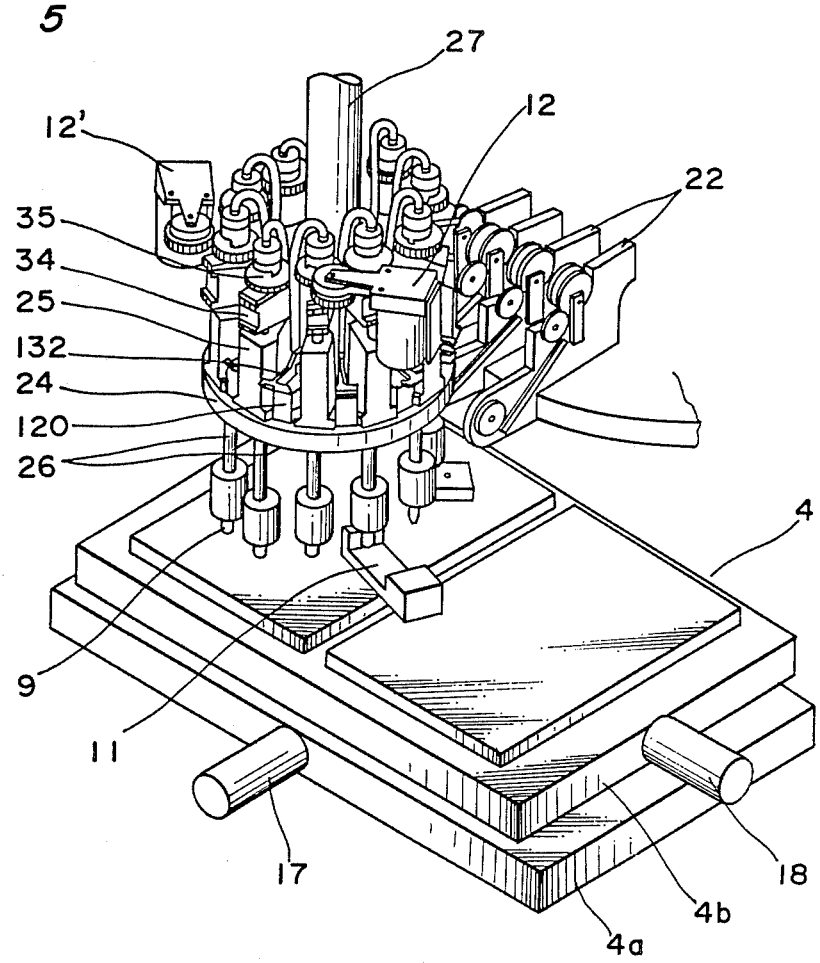
FIGS. 5 and 6 are perspective and axial sectional views, respectively of a component mounting head used in the apparatus, respectively.
Figure 6:
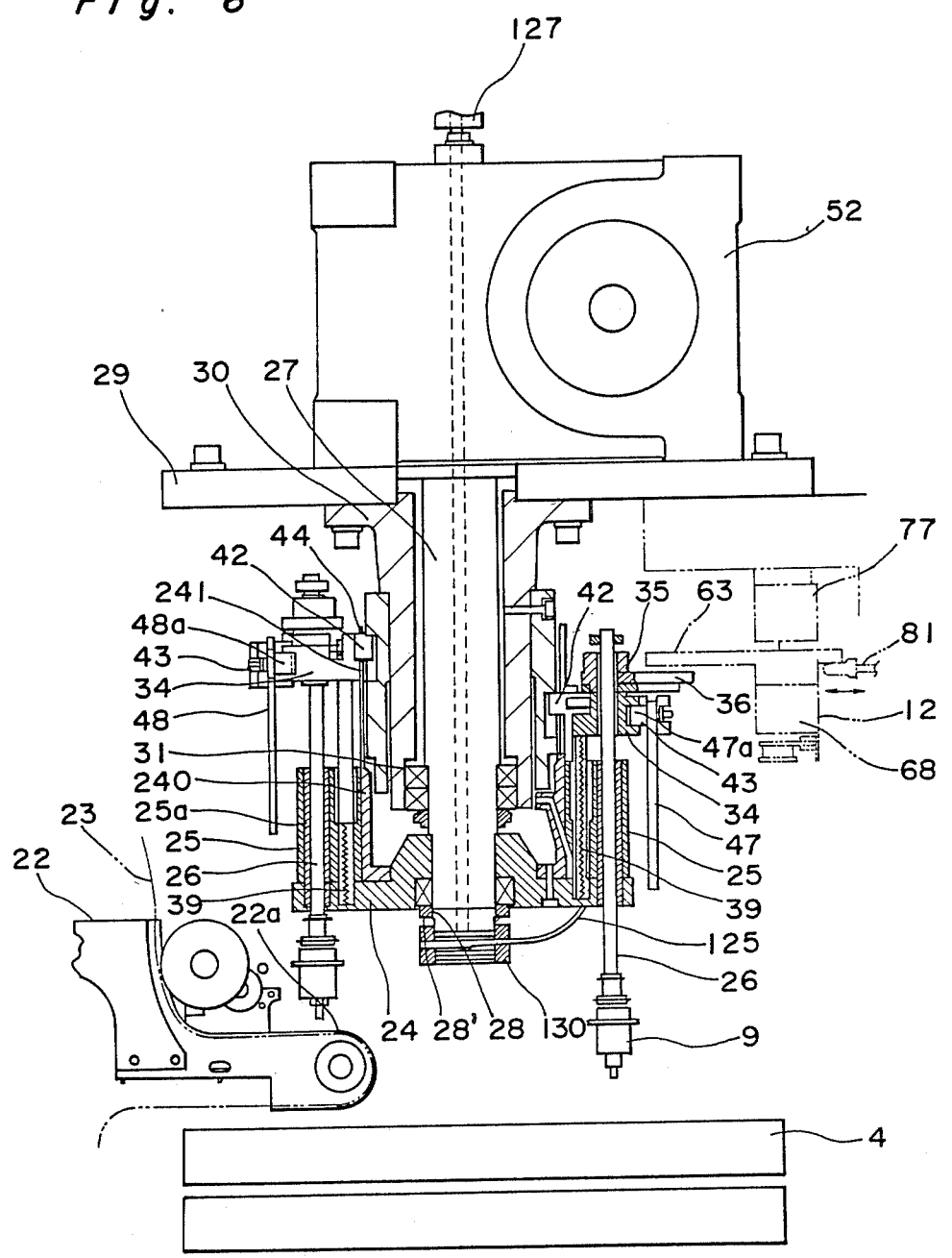

As shown in FIGS. 5 and 6, the mounting head 6 is of a construction wherein nozzle carrier shafts 26 are mounted on an outer peripheral portion of a rotary framework 24 through slide bearings 25 for rotation about the respective longitudinal axes thereof and also for movement up and down. Each slide bearing 25 has a bearing metal 25a, and each suction nozzle 9 is fitted to a lower end of a nozzle carrier shaft 26. The rotary framework 24 is fixed to a rotatable main shaft 27 through a clamp element 28 by means of a nut 28'. The rotatable main shaft 27 is rotatably supported through a bearing assembly 31 in a tubular main shaft housing 30 secured to the undersurface of a head frame 29 of the machine 1 so as to protrude downwards.

Figure 7:
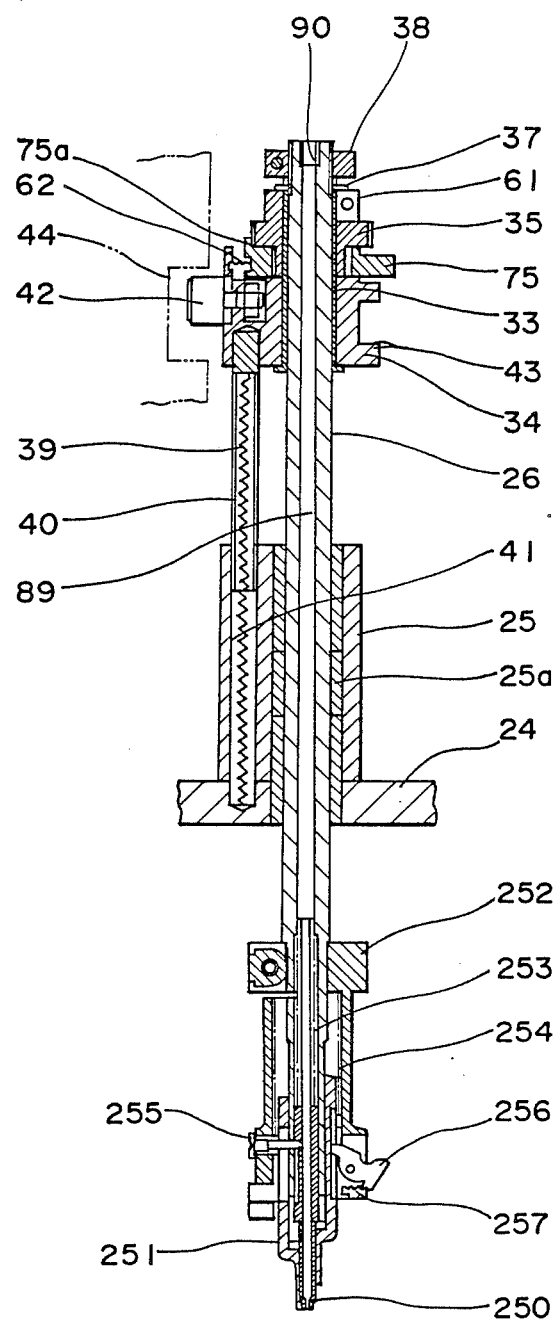
FIG. 7 is a longitudinal sectional view of a nozzle carrier shaft to which a suction nozzle is fitted.

As best shown in FIG. 7, the nozzle carrier shaft 26 has a sleeve 33 mouned on an upper end portion thereof, and a vertical drive block 34, a transmission gear 35 and a lock member 75 are mounted exteriorly on the sleeve 33 and are kept in position on the sleeve 33 by means of a split ring washer 37. The transmission gear 35 is adapted to be meshed with a nozzle drive gear 36 of the nozzle drive unit 12 (FIG. 6). A boss portion of the transmission gear 35 is provided with a groove 35a which is detected by the sensors 97 and 98 (FIG. 8) for the original position detection. An upper end of the sleeve 33 is engaged with an adjustment nut 38 for the adjustment of the position of the nozzle carrier shaft 26 in the vertical direction, which nut 38 is mounted on an upper end of the nozzle carrier shaft 26. The weight of the nozzle carrier shaft 26 is supported by a carrier shaft lifting spring 39 through the vertical drive block 34. The lifting spring 39 is accommodated within a tubular shaft 40 which concurrently serves as a rotation preventing shaft. The tubular shaft 40 is vertically movably received in a guide hole 41 formed in the slide bearing 245 for the nozzle carrier shaft 26.

Figure 8:
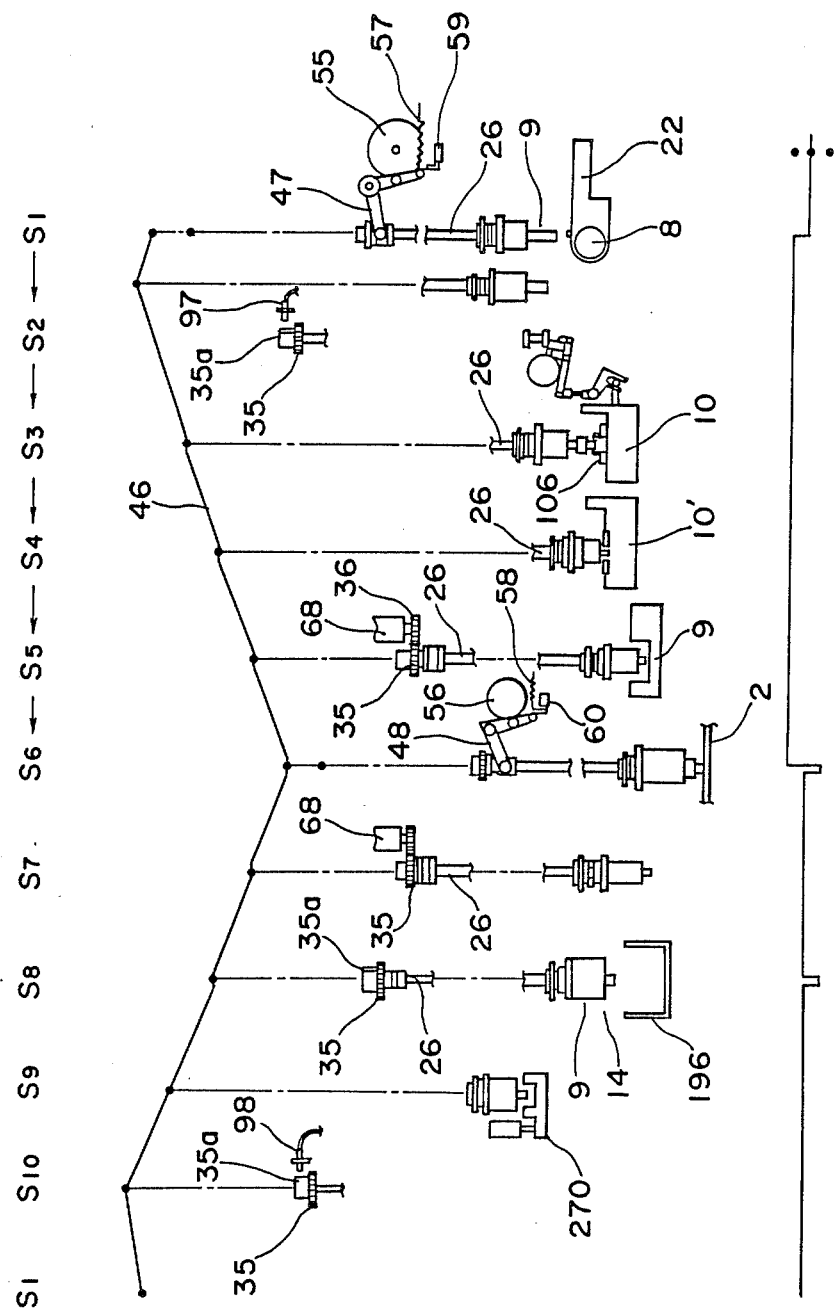
FIG. 8 is a diagram showing the sequence of the steps in the operation of the component mounting head.
Figure 17:
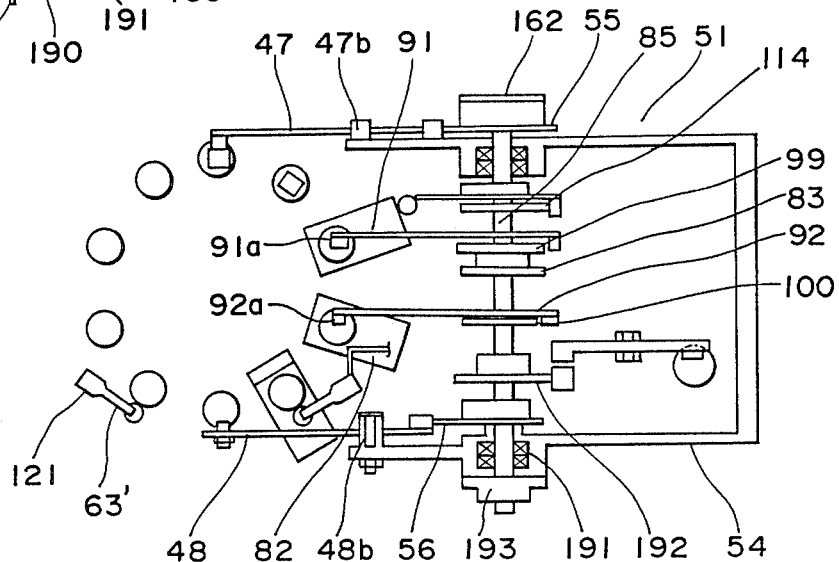
FIG. 17 is a plan view of a drive cam unit for driving the component mounting head.

The vertical drive block 34 is provided with a cam follower 42 rotatably mounted thereon, and is provided with a vertical drive groove 43. The cam follower 42 is engageable with a groove-shaped fixed cam 44 formed circumferentially on a fixed cam barrel 3 on an outer peripheral surface of the main shaft housing 30 (FIG. 6). The fixed cam 44 for the up and down movement of each suction nozzle serves to set the height of each suction nozzle at a predetermined value relative to the various machine parts, such as the component rectifying unit 10 and the component detecting unit 11, disposed at the stations S1 to S10, and is so configured as shown in FIG. 8. If the various machine parts such as the component rectifying unit 10 are arranged at a predetermined height, the fixed cam 44 may not be needed. The vertical drive groove 43 in the vertical drive block 34 is engageable respectively by engagement rollers 47a, 91a, 92a and 48a of a sucking cam lever 47 (FIG. 6), vertical rectifying cam levers 91 and 92 (FIG. 7) and a mounting cam lever 48 which are respectively disposed at the component receiving station S1, the component rectifying stations S3 and S4 and the component mounting station S6. The engagement rollers 47a, 91a, 92a and 48a are received in a guide hole 241 defined in a slide guide 240 so as to extend in a vertical direction and are prevented thereby from undergoing any rocking motion. The slide guide 240 is in a tubular form and is loosely mounted on the outer periphery of the fixed cam barrel 3, but fixed to the rotary framework 24, a guide hole 241 being provided for each nozzle carrier shaft 26. The cam levers 47, 91, 92 and 48 are, as shown in FIG. 17, supported within a cam casing 54 of a head drive cam unit 51 for pivotal movement in a vertical plane about a support shaft 47b, a support shaft 48b and a cam shaft 85 and are respectively driven by a sucking cam 55, vertical rectifying cams 91 and 92, and a mounting cam 56. The cam levers 47, 91, 92 and 48 are urged by biasing springs 57, 93, 94 (not shown) and 58 (FIG. 8) towards the cams 55, 91, 92 and 96, respectively, but can be separated from respective cam faces by respective stopper-equipped cylinders 59, 95, 96 (not shown) and 60. A cam unit 51 for the drive of the head will be described in detail later.

In FIG. 7, the transmission gear 35 is rigidly secured to the nozzle carrier shaft 26 by means of a fastening bolt 61. The rotation locking member 75 has a lock pawl 75a fitted thereto by the vertical drive block 34 for movement towards and away therefrom in a direction radially of the transmission gear 35 and detachably engageable with the transmission gear 35. The rotation locking member 75 is normally urged by a lock spring 62, disposed between it and the block 34, to cause the lock pawl 75a to be meshed with the transmission gear 35 thereby locking the gear 35 against rotation, but when the rotation locking member 36 is depressed against the lock spring 62, the transmission gear 35 can rotate.

Figure 11:
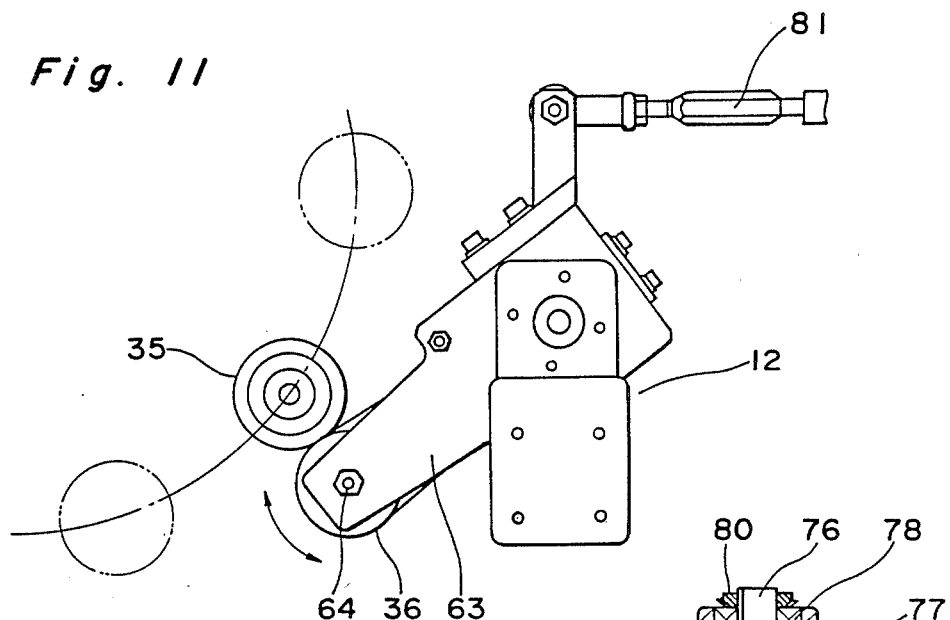
FIG. 11 is a plan view of a nozzle rotating device used in the apparatus.
Figure 12:
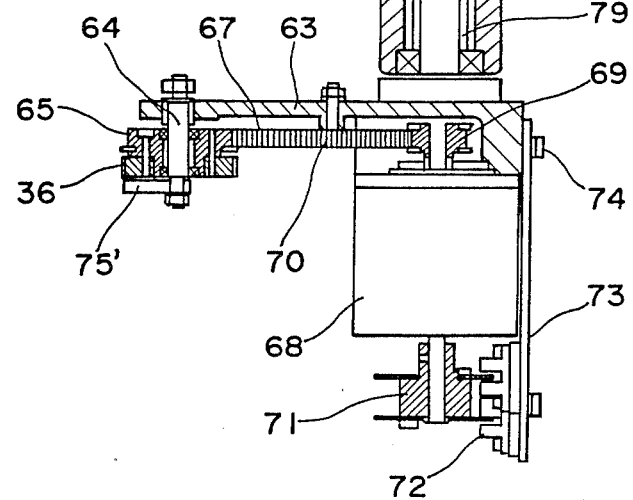
FIG. 12 is a sectional view of the nozzle rotating device.
Figure 13:
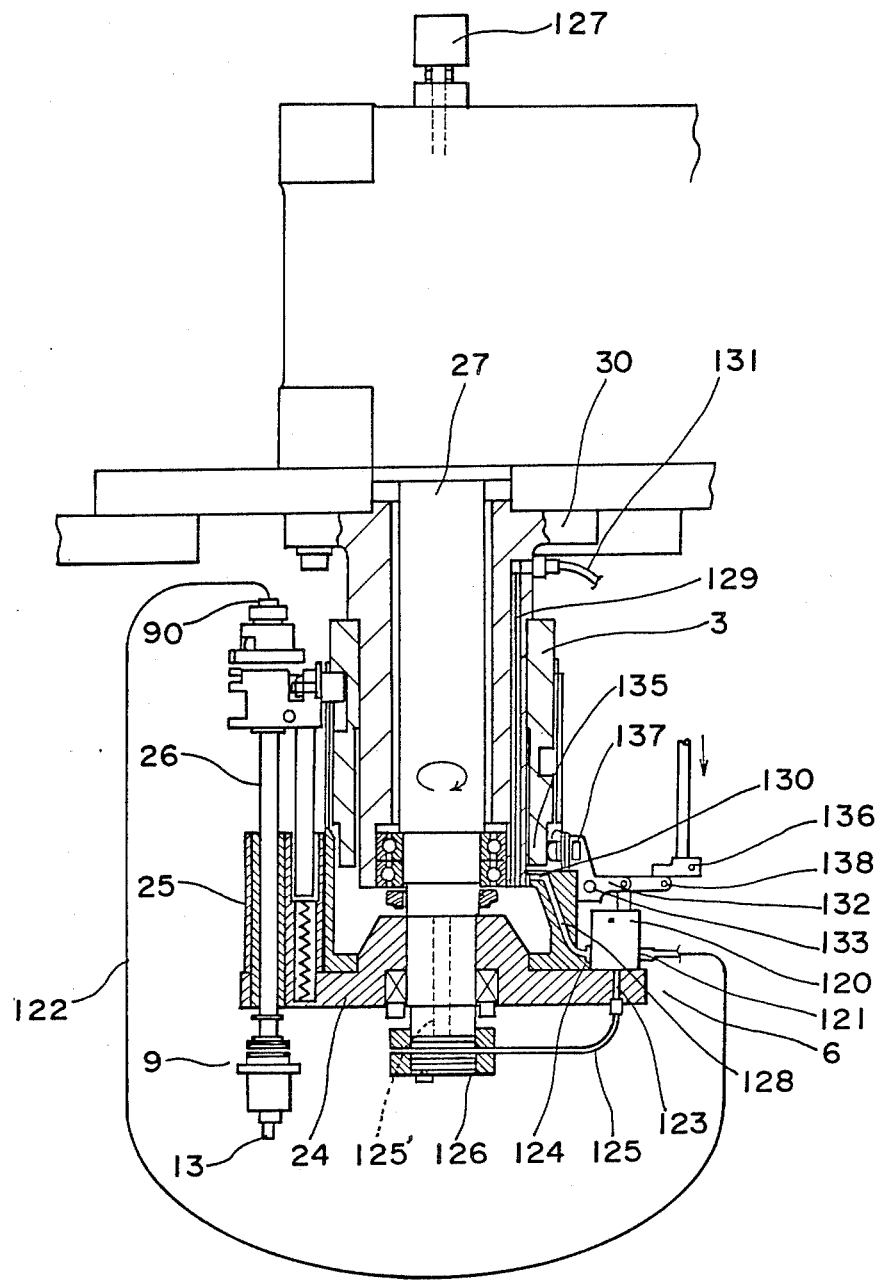
FIG. 13 is an axial sectional view of the component mounting head as viewed from an angle different from FIG. 6.
Figure 14:
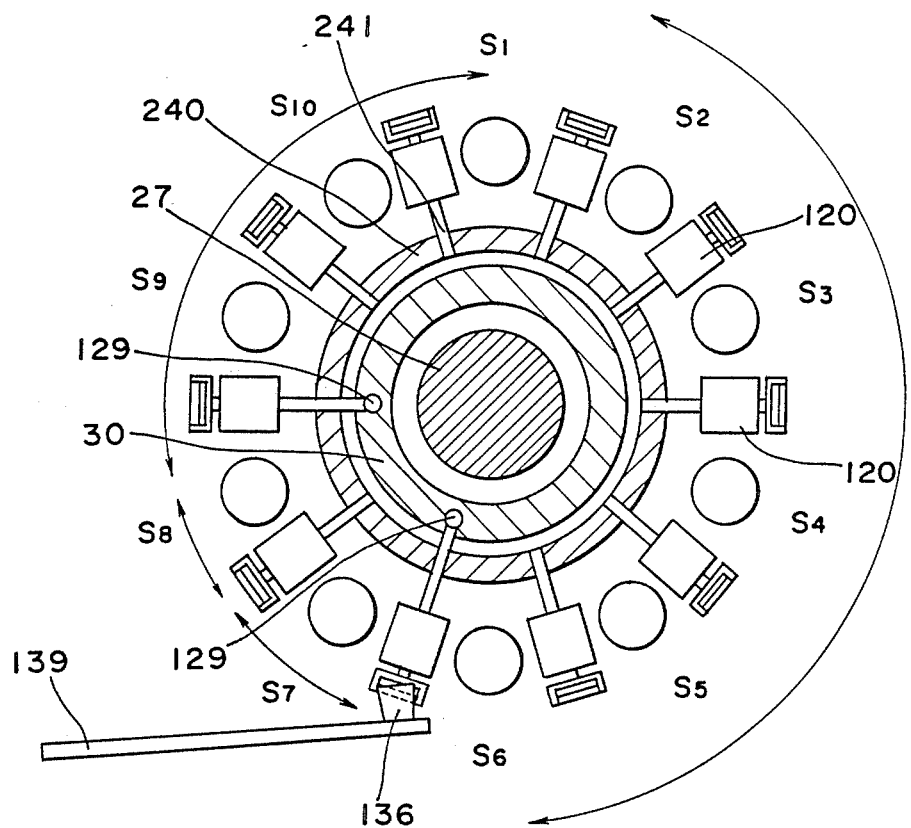
FIG. 14 is a plan view of a pneumatic circuit for the component mounting head.

The suction nozzle drive unit 12 is, as shown in FIGS. 11 and 12, constituted by a pivotable lever 63 carrying a nozzle drive gear 36 engageable with the transmission gear 35 and is operable in such a manner that, when the pivotable lever 63 is pivoted, the nozzle drive gear 36 can be disengaged from the transmission gear 35. The nozzle drive gear 36 is mounted on a support shaft 64 together with a pulley 65 and can be driven by a stepper motor 68 through a timing belt 67. Reference numeral 69 designates a pulley on the stepper motor 68, a reference numeral 70 designates a tensioning pulley. The stepper motor 68 is rigidly mounted on the pivotable arm 63. The stepper motor 68 is fitted with a rotation detecting plate 71, and the sensor 72 is fixed to the pivotable lever 63 through a sensor support plate 73 by means of screws 74. Also, release dog 75' for depressing the lock member 75 (FIG. 7) of the transmission gear 35 is provided on the support shaft 64 of the nozzle drive gear 36. The support shaft 76 for the pivotable lever 63 is rotatably supported by a support member 77 by means of a bearing 78. Reference numerals 79 and 80 designate a collar and a bearing fixing nut. The support member 77 is fixed to the head frame 29 of the machine 1. Rotation of the pivotable lever 63 is carried out by a cam lever 82 (FIG. 17) connected through a tie rod 81. The cam lever 82 is pivotable up and down and is pressed against an operating cam 83 for the suction nozzle drive unit by a cam face pressing cylinder (not shown). The drive unit operating cam 83 is fitted to a main cam shaft 85 and can be rotated.

Figure 16:
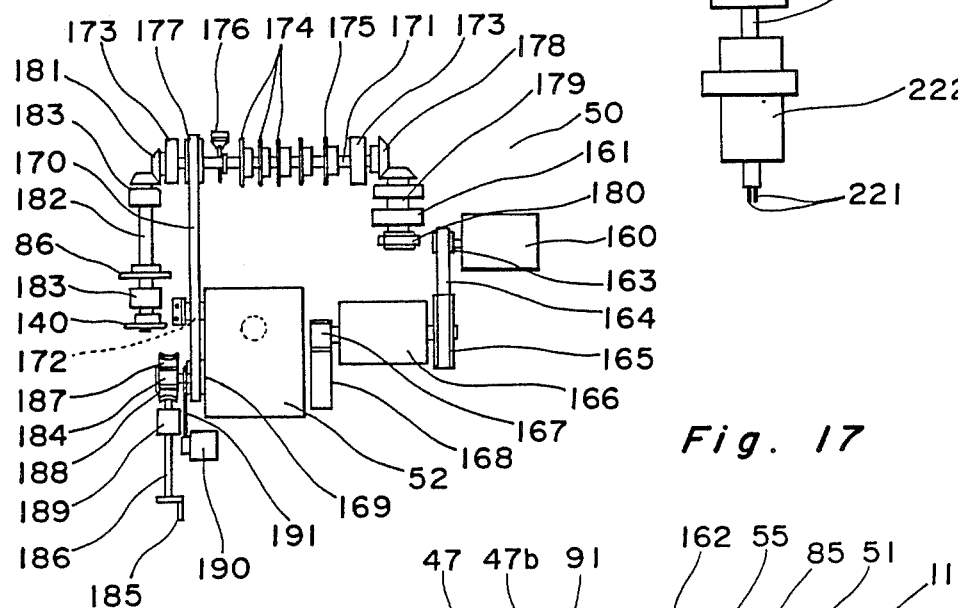
FIG. 16 is a plan view of a top drive unit thereof.

The nozzle reversing unit 12' is constructed in a fashion similar to the nozzle rotating unit 12. The pivotal movement of a pivotable lever 63' of the reversing unit 12' can be effected by a cam lever (not shown) driven by a nozzle reversing cam 86 (FIG. 16).

Each suction nozzle 9 is, as shown in FIG. 7, provided with a tube 250 held in contact with the inner peripheral surface of a lower end of the carrier shaft 26, and an outer tube 251 held in the outer peripheral surface thereof, both oriented downwards, and, at a lower end of the outer tube 251, the diameter of the outer tube 251 is reduced so as to cause the outer tube 251 to contact the inner tube 250. A holder 252 is fixed to the carrier shaft 26 in contact with the outer tube 251. Both of the outer and inner tubes 251 and 250 are downwardly biased by springs 253 and 254, and the lowermost limit position and the position in a circumferential direction thereof are defined by a pin 255 provided in the holder 252 so as to extend radially thereof across the outer tube 251 and engaged in a groove in the inner tube 250. As the left-hand section of FIG. 7 shows, the lower end of the outer tube 251 is at this time positioned slightly below the lower end of the inner tube 250, so that the suction area of each nozzle can be increased to obtain an increased suction force. Also, the right-hand section of FIG. 7 illustrates a condition in which a stepped shoulder formed on the outer periphery of the outer tube 251 is brought by a lever 356, provided in the holder 254, into abutment with the outer tube 251 to lift the latter upwards. Thereby, a minute electronic component can be sucked by the inner tube 250. The lever 256 maintains the condition by the action of a spring 257.

The component rectifying unit 10 is, as shown in FIG. 9, provided with two pairs of rectifying fingers 14 and 106 which are movable along guide rods 105 and which are so disposed as to generally intersect with each other, said fingers 14 and 106 of each pair being driven in a direction towards and away from each other by a respective link mechanism 107. Reference numeral 108 designates a body of the rectifying unit. The direction in which the rectifying fingers 106 of one pair move to close and open is radially of the component mounting head to rectify each component in the Y-axis direction, and the drive of the link mechanism 107 for moving the rectifying fingers of the other pair for rectifying each compnent in the X-axis direction is effected by the rotation of the rectifying cam 114 which is transmitted thereto through a rectifying cam lever 113 pivotable about a pin 112, a connecting rod 111, a pivot lever 110 and a connecting rod 109. The rectifying cam lever 113 is urged against the rectifying cam 114 by the cam face pressing cylinder 115. To describe the component rectifying unit 10 in more detail, as shown in FIG. 9(a), the link mechanism 107 comprises rectifying levers 302 and 311 for the rectification in the X-axis and Y-axis directions, respectively, which are pivotable about a support shaft 301, and pairs of links 303 connecting portions of the rectifying levers 302 and 311 adjacent respective ends with the rectifying fingers 106 and 14. The rectifying levers 302 and 311 have one end urged by respective rectifying springs 304 (not shown) in a direction conforming to the opening direction of the rectifying fingers 106, and the rectifying fingers 106 can be opened by causing the tip of the connecting rod 109 to push a pin 305 on the other end thereof. Reference numeral 307 designates a stopper, reference numeral 308 designates a side bearing for the connecting rod 109, reference numeral 309 designates a spring retaining lid, and reference numeral 310 designates a spring retaining rod.

The electric contact members 106b of the rectifying fingers 106a are electrically insulated from the rectifyingfingers 106a and are electrically wired so as to output a measured value of current to a measuring instrument.

Figure 9A:
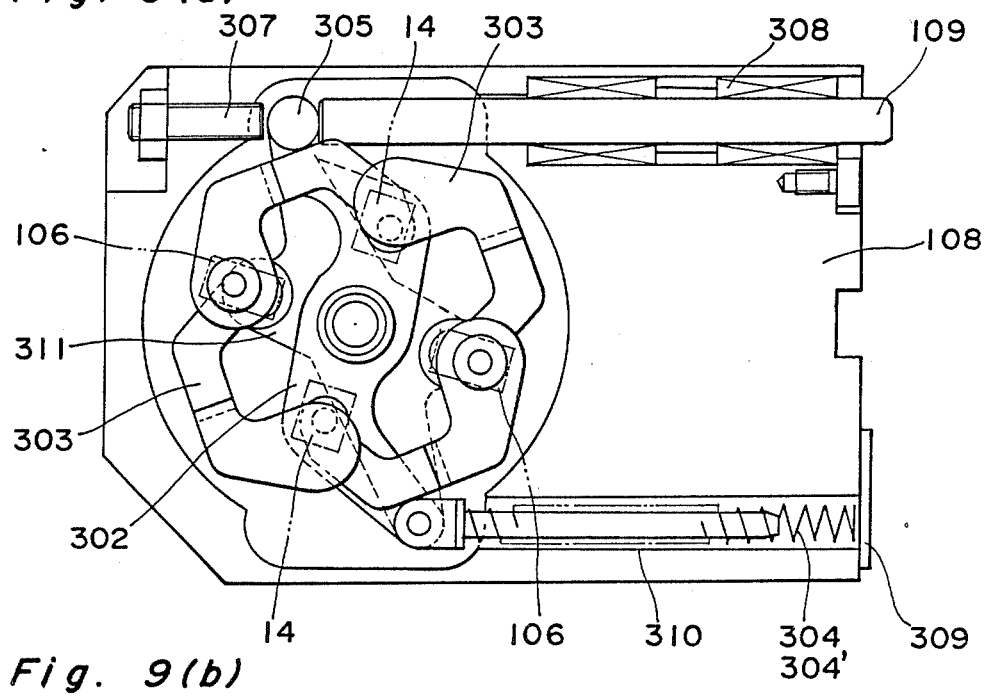
FIGS. 9(A) to 9(C) are plan and elevation views of a component rectifying device used in the apparatus.
Figure 9B:
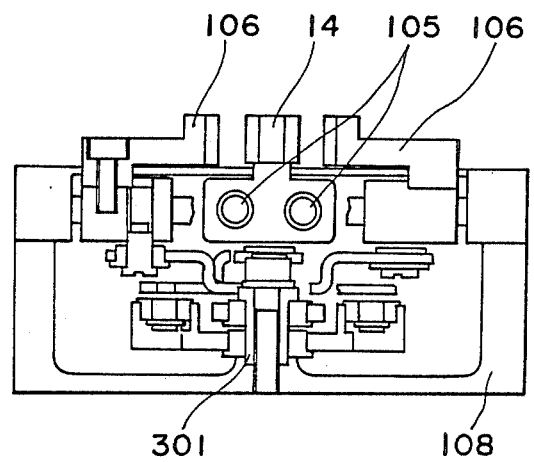
Figure 9C:
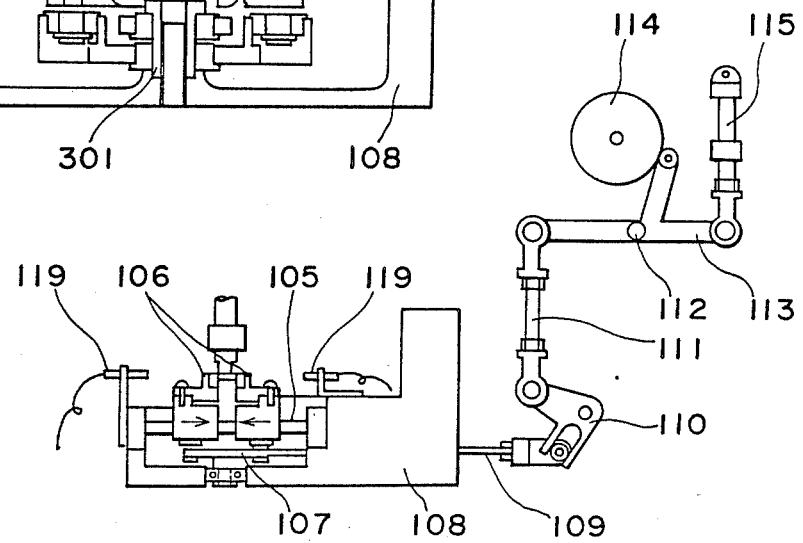
Figure 9D:
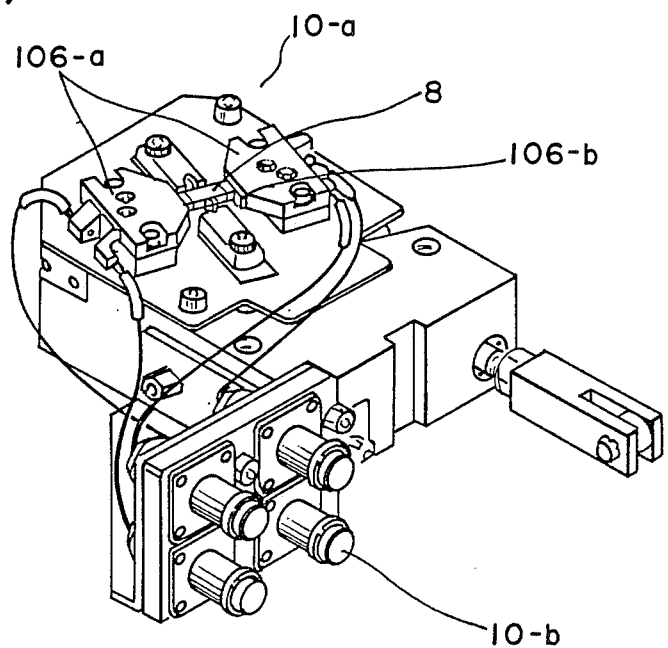
FIG. 9(D) is a perspective view of the component rectifying unit.

FIG. 9(d) illustrates the component rectifying unit 10-a for the verifier wherein the component 8 is sandwiched between contact member 106b which concurrently serve as the element-contacting ends of the respective rectifying fingers. Preferably the width of the contact members 106b is preferably greater than the corresponding dimension of the contact on the component 8, while the width of the fingers 14 is less than the side dimension of the component 8. Reference numeral 10-b designates terminals for connecting data from the measuring elements to an amplifier.

Figure 9E:
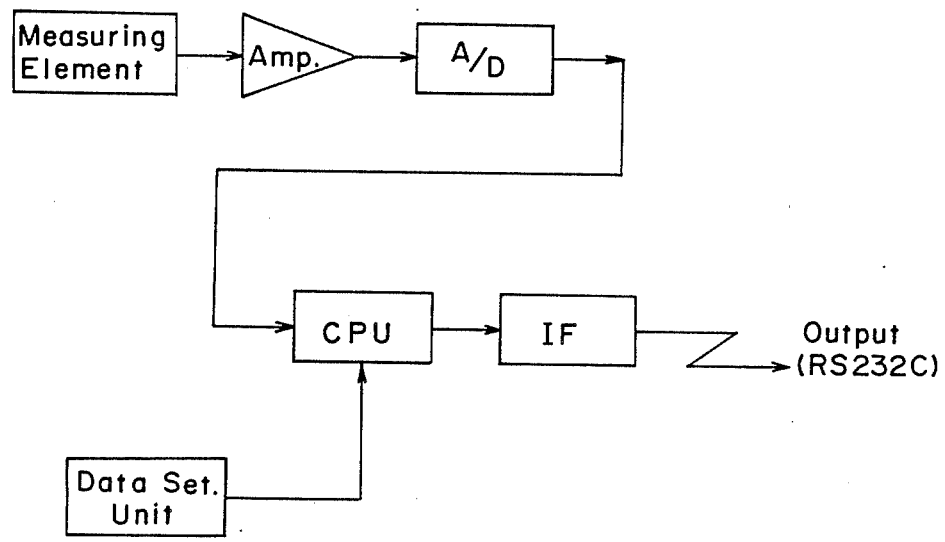
FIG. 9(E) is a block diagram of a verifier.

FIG. 9(e) is a block diagram showing the verifier according to the present invention. A signal from the measuring terminals 106b is, after having been amplified, fed to an analog-to-digital converter and is then compared in a central processing unit with predetermined data. The result of the comparison representative of whether or not the component is good is outputted through an IF to an external circuit.

Reference numeral 119 designates a sensor for detecting whether or not the electronic component is remaining in the component rectifying unit 10.

Figure 10:
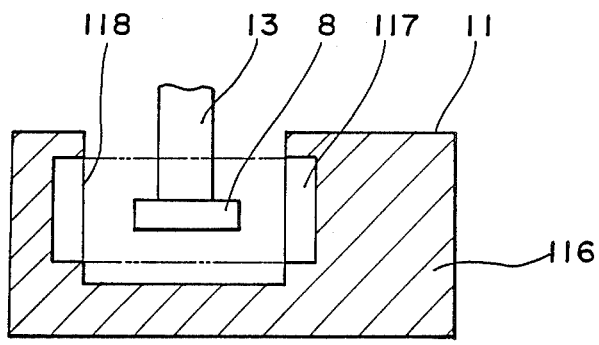
FIG. 10 is a transverse sectional view of a component detecting device used in the apparatus.

The component detecting unit 11 is, as shown in FIG. 10, of a construction wherein a light sensor 117 and a lien sensor 118 are disposed in face-to-face relationship in an inner face of a generally U-shaped body 116. The line sensor 118 detects whether or not the component 8 sucked by the suction nozzle 13 is within a predetermined range of height and detects whether or not the component 8 is properly sucked by the suction nozzle 13.

Figure 19:
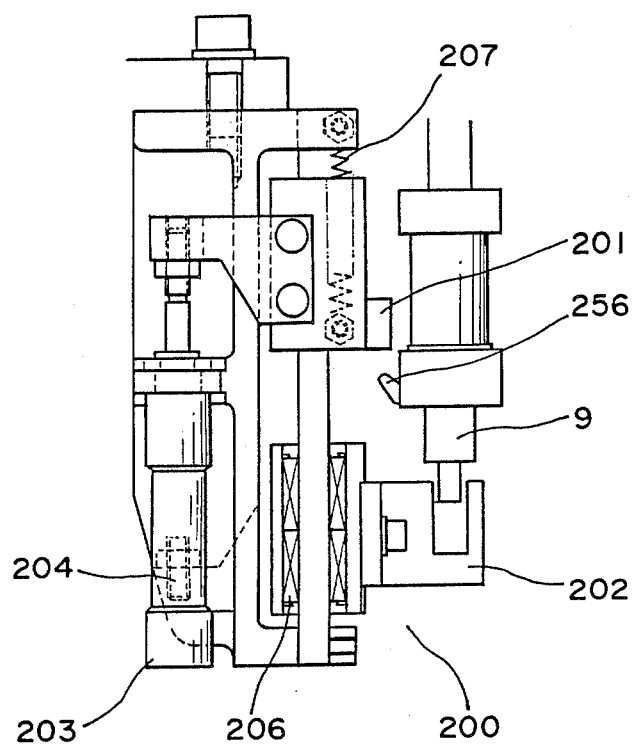
FIG. 19 is a schematic side view of a suction nozzle exchanging device used in the apparatus.

The nozzle exchange unit 200 is disposed in the nozzle exchange station S9 and comprises, as shown in FIG. 19, a pusher 201 for pushing the lever 256 of the suction nozzle 9 from above, a pusher 202 for pushing the outer tube 251 upwardly from below, and actuators 203 and 204 for driving these pushers 201 and 202. Reference numeral 205 designates guides for the pushers 201 and 202 which are slidable on a slide bearing 206. A spring 207 serves to retain on a separate side so as to avoid any possible collison with the suction nozzle 9 in the event that the pushers 201 and 202 cannot be controlled by reason of, for example, disconnection of an air source for the actuators 203 and 204.

Figures 15A, 15B:
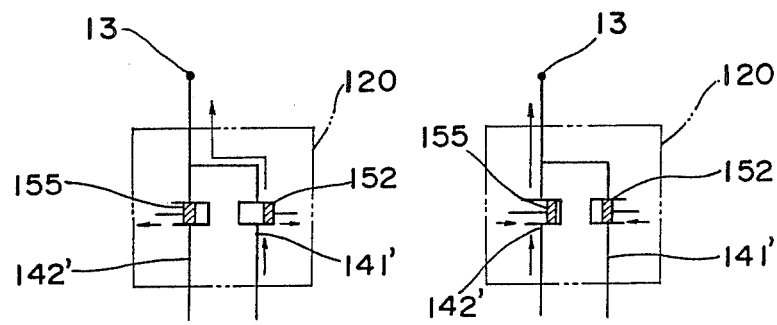
FIGS. 15(A) and 15(B) are schematic diagrams used to explain the operation of switching valves or the component mounting head.

A pneumatic circuit for the suction nozzle 13 will now be described. The suction nozzle 13 is capable of blowing compressed air at each of the mounting and rejecting stations S6 and S8 for ejecting the component, and a switching valve 120 (FIGS. 13 and 14) is disposed in an air flow circuit therefor. The switching valve 120 is normally held in a condition wherein, as shown in FIG. 15(a), a valve body 152 on a negative pressure circuit 141' is opened and a valve body 155 on a positive pressure circuit 142' is closed, and can be switched to the reverse condition, as shown in FIG. 15(b) when a valve switching lever 132 is depressed.

The switching valve 120 is secured to the rotary framework 24 of the component mounting head 6 and positioned between the nozzle carrier shafts 26. To describe the air flow circuit, a flexible pipe 122 is connected between a coupler 90 of an upper end of the nozzle carrier shaft 26 and an outlet 121 of the switching valve 120. A negative pressure inlet 123 in a lower surface of the switching valve 120 is fluid-connected with a vacuum manifold 126 in a lower end of the main shaft through a pipe 125. The vacuum manifold 126 is in turn communicated with a negative pressure passage 125' defined axially in the main shaft 27, an upper end of said passage 125' being fluid-connected with a source of negative pressure through a rotary joint 127. A positive pressure inlet 124 of the switching valve 120 is communicated with a positive pressure passage 128 in the rotary framework 24 which is in turn communicated with a positive pressure passage 129 in the housing. The positive pressure passage 129 is provided only at the component mounting station S6 and the component rejecting station S8 and, when this passage 129 is aligned with the positive pressure passage 128 in the rotary framework as a result of the rotation of the rotary framework, the passages 128 and 129 are communicated with each other. Reference numeral 130 designates a connecting surface thereof. The positive pressure passage 128 in the rotary framework is communicated to the atmosphere during the disconnection. The positive pressure passage 129 in the housing is connected at its upper end with a source of compressed air through a pipe 131.

The valve operating lever 132 of the switching valve 120 is of a generally L-shaped configuration and is pivotally connected to the valve body 120 through a pivot pin 133. This lever 132 can be pivoted by the action of the fixed cam 135 held in contact with a longitudinal portion and also by causing the dog 136 to press a transverse portion. The longitudinal portion is fitted with a cam follower 137 whereas the transverse portion is fitted with a dog engagement roller 138. The valve operating fixed cam 135 is provided on the outer peripheral surface of a fixed cam shaft 3 exteriorly of the main shaft housing 30. The range of the valve operating fixed cam 135 in which the valve operating lever 132 is depressed is, as shown in FIG. 8, within the range from the component mounting station S6 to the component receiving station S1. The vertically driving dog 136 for the valve is provided at the component mounting station S6 and can be driven up and down by the cam 140 (FIG. 16) for the valve by means of the lever 139.

The relationship between the top drive unit 50 (FIG. 2) and the head drive cam unit 51 will now be described. The top drive unit 50 is, as shown in FIG. 16, provided with a motor 160 which forms a drive source for the whole apparatus, the drive of said motor 160 being transmitted to a pulley 162 on the main cam shaft 85 of the head drive unit 51 from a pulley 161, to which it is transmitted through various members from the motor 160, through a timing belt (not shown). The motor 160 of the top drive unit 50 is operatively coupled with an indexing unit 52 through a pulley 163, a timing belt 164, a pulley 165, a clutch brake 166 and gears 167 and 168. The indexing unit 52 is operable to control the intermittent rotation of the component mounting head 6. A pulley 169 on the output side of the indexing unit 52 is coupled with a cam shaft 171 through a timing belt 170 having its generally intermediate portion trained over a tensioning pulley 172. The cam shaft 171 is rotatably supported by a bearing 173 and is provided with a cam 174 for driving various parts of the component supply cassette 22 and also with a cam 175 for driving the switching valve 120. Also, a rotation detecting sensor 176 for ascertaining the rotation and its associated dog 177 are provided. One end of the cam shaft 171 is drivingly connected through a bevel gear unit 178 with a rotary shaft 179 of the pulley 161 for the transmission towards the head drive cam unit 51. The other end of the cam shaft 171 is drivingly connected through a bevel gear unit 181 with a cam shaft 182 for the chuck return rotation. The cam shaft 182 is fixedly provided with the valving cam 140 for operating the vertical dog 136 of the switching valve 120. Reference numeral 183 designates a bearing. An output shaft 184 of the indexing unit 52 is coupled with a rotary shaft 186 of a manually rotatable adjustment handle 185 through a worm wheel 187 and a worm gear 188. The worm wheel 187 has a one-way clutch built therein. Reference numeral 189 designates a bearing. The output shaft 184 of the indexing unit 52 is also coupled with an electro-cycle timer 190 through a timing belt 191. The electro-cycle timer 190 is used for synchronizing the respective operations of the various parts.

The head drive cam unit 51 is of a construction wherein the main cam shaft 85 is fitted to the cam casing 54 through a bearing 191. The main cam shaft 85 has a generally inermediate portion having mounted thereon the rectifying cam 114 of the component rectifying unit 10, the nozzle driving cams 99 and 100 for driving the nozzle up and down at the rectifying station, the suction nozzle operating cam 83 of the sucking and rotating unit 12, and a vertically driving cam 192 for driving the bond applicator unit 5 up and down. The main cam shaft 85 has mounted at its opposite ends the sucking cam 55 and the mounting cam 56 for driving a suction cam lever 47 for selectively lifting and lowering a chuck carrier shaft 26 and for driving a mounting cam lever 48. The main cam shaft 85 is also provided with a brake 193.

Figure 18:
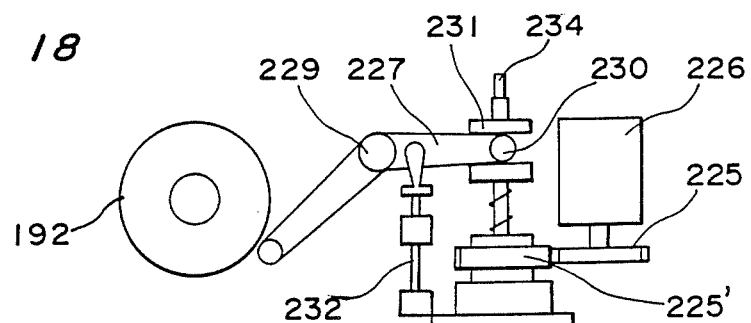
FIG. 18 is a schematic side view of a bond applicator used in the apparatus.
Figure 20:
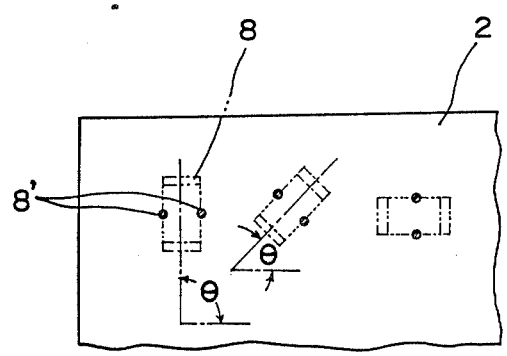
FIG. 20 is a fragmental plan view of a circuit wiring board.
Figure 22:
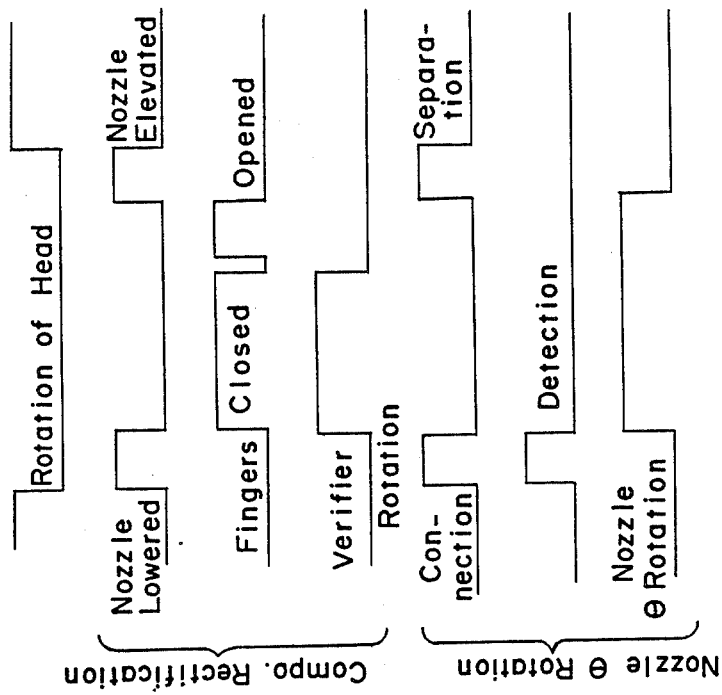
FIG. 22 is a timing chart showing sequences of operation of the various component parts of the apparatus which take place during each intermittent movement of the component mounting head.
Figure 21:
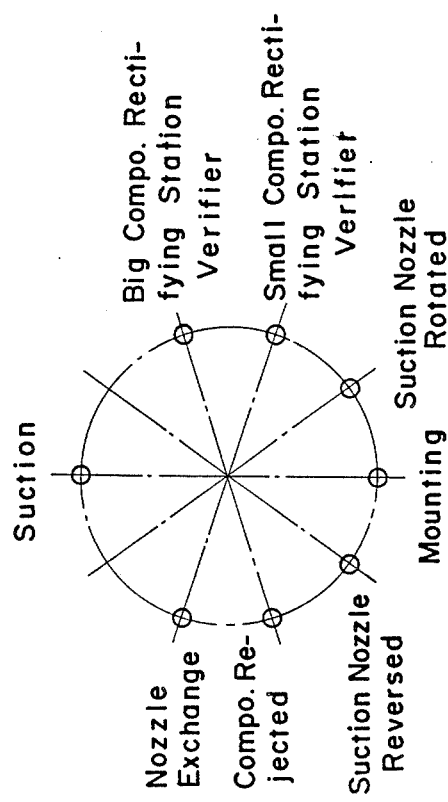
FIG. 21 is a diagram showing respective positions at which the component mounting apparatus being rotated can be brought to a halt.
Figure 24:
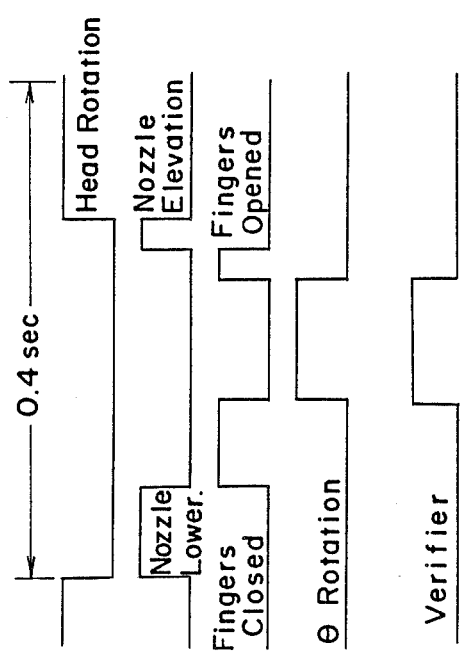
FIG. 24 is a timing chart of the conventional component mounting apparatus.
Figure 23:
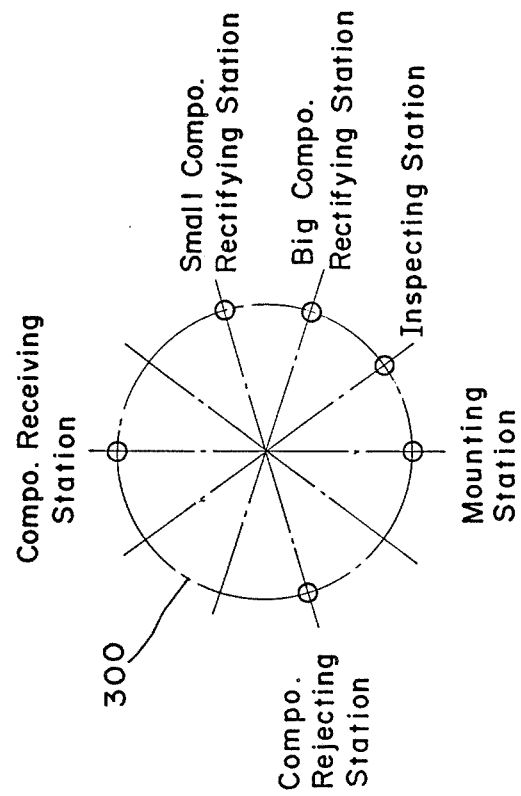
FIG. 23 is a diagram used to explain the operation of the conventional component mounting apparatus.
Figure 25:
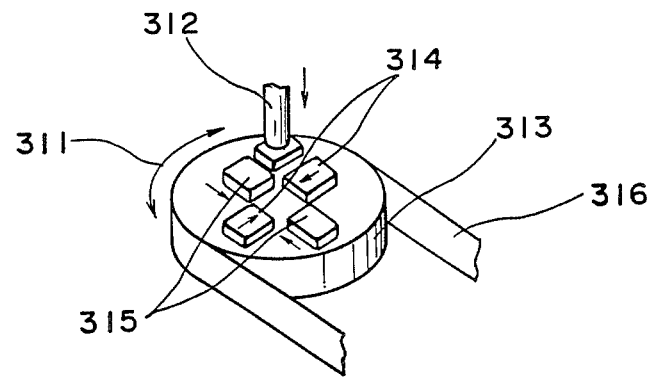
FIG. 25 is a fragmental perspective view thereof.
Figures 26A, 26B:
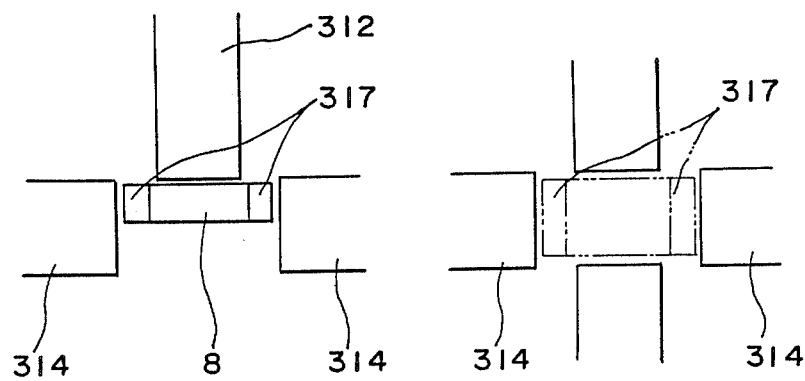
FIGS. 26(A) and 26(B) are schematic front elevational and top plan views, respectively, of the rectifying fingers thereof.

The bond applicator unit 5 (FIG. 1) is of a construction wherein, as shown in FIG. 18, a bond agent tank 222 having two nozzles 221 is mounted on a bearing housing 224 through a nozzle support shaft 223 for rotation and also for movement up and down. The two nozzles 221 are, as shown in FIG. 20, so spaced a substantial distance from each other that bond applying regions 8' can be formed adjacent the opposite sides of each component 8, and can be rotated together with the nozzle support shaft 223 depending on the angle $\theta$ of each component 8 relative to the circuit wiring board 2. The rotation of the nozzles 221 is effected by a motor 226 through a gear 225 meshed with a gear 225 on the nozzle support shaft 223. The vertical movement of the nozzles 221 can be effected by the rotation of the cam 192 through a cam lever 227. The cam lever 227 is pivotable up and down about a support shaft 229, and has mounted on its free end a roller 230 engaged with a roller guide 231 on the nozzle support shaft 223. This cam lever 227 is urged towards the cam 192 by the action of an air cylinder 232. The nozzle support shaft 223 has an upper end formed with a compressed air supply port 234 and has defined therein an air passage communicated with the bond agent tank 222. It is to be noted that the number of the nozzles 221 may be one, in which case the nozzle may not have the capability of being rotated.

The operation of the machine will now be described. To describe briefly, the right-hand circuit wiring board 2' as viewed in FIG. 1 is the one newly loaded onto the X-Y table assembly 4 and is ready to be a bonding agent applied thereto by means of the applicator unit 5. The left-hand circuit wiring board 2 on the X-Y table assembly 4 is the one which has been slid on the X-Y table assembly after the completion of the application of the bonding agent to various parts, each component 8 being mounted by the component mounting head 6 onto that portion of the circuit wiring board where the bonding agent has been applied. The application of the bonding agent and the component mounting are carried out in synchronized fashion.

The component mounting operation will now be described. As shown in FIG. 8, the nozzle carrier shaft 26 is lowered at the component receiving station S1 to permit the respective suction nozzle 13 to suck one component 8 from the component supply cassette 22. The lowering of the nozzle carrier shaft 26 which takes place at this time is effected by causing the cam lever 47 to depress it. The selection of the suction nozzle as to its size is carried out in advance by a NC command in dependence on the size of the component.

When the component 8 has been sucked, the cam lever 47 is raised accompanied by the lifting of the nozzle carrier shaft 26, followed by the rotation of the component mounting head 6 over a distance equal to one pitch between the neighboring suction nozzles.

When the carrier shaft 26 has been brought to the second stop station S2, the angle of the carrier shaft 26 is detected by the sensor 97 to ascertain that the angle of rotation of the suction nozzle 6 lies in the original point.

When the carrier shaft 26 has been brought to the component rectifying station S3 or S4 as a result of the continued rotation of the component mounting head 6, the rectifying fingers 14 and 106 of the component rectifying unit 10 are closed to rectify the position of the component 8 in two directions perpendicular to each other. Simultaneously with the rectification, an electric current is allowed to flow to the terminals 106a of rectifying fingers 106 to check electric characteristics of the component 8. Also, whether or not the component 8 is present is checked by the sensor 109.

At the component rotating station S5, the pivotable lever 63 of the nozzle rotating unit 12 is pivoted to cause the nozzle drive gear 36 to engage the transmission gear 35 on the carrier shaft 26 so that the carrier shaft 26 can be rotated by the stepper motor 68. In this way, the angle $\theta$ of the component 8 relative to the circuit wiring board 2 can be adjusted to any desired value. It is to be noted that the transmission gear 35 can be rotated only when the rotation locking member 75 is released by a lock releasing dog 75' upon the engagement between the gears 35 and 36. Also, it is so designed that the nozzle drive gear 36 is not returned to the original point subsequent to the rotation of the suction nozzle 9, permitting the rotation of the next succeeding suction nozzle. Because of this, the positions of teeth of the gears 35 and 36 when they are meshed with each other are not always identical and, therefore, any possible local wear of one or both of these gears 35 and 36 can be avoided.

The detection of the component takes place when the drive gear 36 is meshed with the gear 35. Whether or not the component 8 retained by the associated suction nozzle 9 lies at the predetermined height is detected so that whether or not the component is properly retained thereby can be detected. Should it not be properly retained, the fact is memorized and the component not properly retained is subsequently ejected at the rejecting station.

When arriving at the component mounting station S6, the carrier shaft 26 is lowered by the cam lever 48 with the component 8 consequently pressed by the suction nozzle 9 to the circuit wiring board 2 to bond the latter to the circuit wiring board 2. At this time, by the action of the dog 136, the valve operating lever 132 of the switching valve 120 is temporarily depressed to bring the switching valve 120 in a condition in which the positive pressure passage is opened. Because of this, compressed air is blown from the suction nozzle 9 to release the component 8 from the suction nozzle, thereby avoiding any possible defective mounting of the component while the latter remains sucked by the suction nozzle 9. Where the mounting is determined to be defective or impossible at the component detecting station S4, the stopper-equipped cylinder 60 (FIG. 8) is actuated to cause the cam lever 48 not to lower the carrier shaft 26. Also, no blowing of the compressed air is effected. In this way, the component 8 unable to be sucked remains sucked by the suction nozzle 9.

At the nozzle reversing station S7, the pivotable lever of the nozzle reversing unit 12' is pivoted to cause the nozzle drive gear 36 to be meshed with the transmission gear 35 on the carrier shaft 26, thereby reversing the nozzle carrier shaft 26 through an angle of $-\theta$. Also, by for the reason that, since at the component mounting station S6, the valve operating lever 120 has been depressed by the action of the valving cam 140, the switching valve 120 is in a condition wherein the positive pressure passage is opened, compressed air can be blown from the suction nozzle 13 when at the defective component mounting station S8 the positive pressure passage 128 (FIG. 13) in the rotary framework is aligned with the positive pressure passage 129 in the housing. Therefore, where the component 8 remains sucked by the suction nozzle 9 because it is incapable of being sucked, such component 8 can be ejected into the recovery box 196 when at the rejecting station S8.

At the nozzle exchange station S9, one of the inner and outer tubes 250 and 251 is selected by the NC command depending on the type and the size of each component 8 to be subsequently sucked by the next suction nozzle 9.

At the detecting station S10 at which the original point for the rotation of the suction nozzle is detected, the original point is detected by the sensor 98.

The foregoing operation is cyclically performed by each suction nozzle 9. It is to be noted that, where each suction nozzle 9 is desired to pass through the mounting station S1 with no component 8 being sucked thereby, the stopper-equipped cylinder 50 (FIG. 8) has to be actuated to avoid the lowering of the carrier shaft 26 by means of the cam lever 47.

The mounting of the components 8 is performed in the manner as hereinabove described. In particular, since the component rectification and the component angle adjustment are carried out at the separate stations S3 and S5 for the mounting head 6, not only will the rotation not be adversely affected even if the checking of the electric characteristics of each component 8 is performed simultaneously with the component rectification, but also it can be performed in a simple and stable manner because the component is retained from four directions. Moreover, the checking of the presence or absence of each component at the rectifying station is effective to avoid any possible trouble which may be brought to a subsequent process station.

Although the present invention has been described in connection with the preferred embodiment with reference to the accompanying drawings, it is to be noted that various changes and modifications will be apparent to those skilled in the art. By way of example, although in the foregoing embodiment the suction nozzles 9 have been described as mounted on the rotary component mounting head, the present invention can be equally applicable even though the suction nozzles 9 are made to move along a generally oval path or any other curved path.

Accordingly, such changes and modifications are to be understood as included within the scope of the present invention as defined by the appended claims unless they depart therefrom.

What is claimed is:

1. In a method of feeding components for mounting on a circuit board and having contacts along opposite ends and sides between said opposite ends, the steps of:
    causing a plurality of successive suction nozzles to move intermittently along a predetermined path in synchronism with each other and successively pick up components at a component receiving station and then move through a succession of stations toward a component mounting station where the components are to be mounted on a circuit board;
    holding the successive suction nozzles still at one of the stations between the receiving station and the component mounting station;
    effecting both the rectification of the position of each component in two directions perpendicular to each other and electrically testing the component by bringing rectifying fingers having electric contact members on the ends thereof which are at least as long as the component contacts are wide and with contact surfaces corresponding to the side surfaces of the components into face-to-face contact with the sides of the components in a second direction perpendicular to the first direction; and
    passing a test current through the thus held component for testing the electrical characteristics thereof.

2. In the method of claim 1, the further step of holding the successive suction nozzles still at a further of the stations between the receiving station and the component mounting station and adjusting the angle of the component held on the respective suction nozzles by rotating the suction nozzle around the longitudinal axis thereof.

3. In the method of claim 2, the further steps of moving the suction nozzles further along said predetermined path past said component mounting station, holding the successive nozzles still at a reversing station past said component mounting station, and rotating the nozzles in the opposite direction to the direction they were rotated at said still further station back to their initial position.

4. In an apparatus for feeding components for mounting on a circuit board and having contacts along opposite ends and sides between said opposite ends, the combination of:
    means carrying a plurality of successive suction nozzles and movable along a predetermined path in synchronism with each other, and moving means for moving said carrying means intermittently past a component receiving station and a succession of stations toward a component mounting station where components are to be mounted on a circuit board and for stopping said carrying means for positioning a nozzle at said stations;
    rectification and electrical testing means at one of said stations between said component receiving station and said component mounting station and having a pair of spaced opposed rectifying and testing fingers movable toward and away from each other in a first direction, said rectifying and testing fingers having electric contact members on the opposed ends thereof which are at least as long as the component contacts are wide and with contact surfaces corresponding to the surface of the component contact surfaces, and having a pair of spaced opposed rectifying fingers movable toward and away from each other in a second direction perpendicular to said first direction along a line midway between said rectifying and testing fingers and with contact surfaces corresponding to the side surfaces of the components, the position where said line intersects a further line between said rectifying and said testing fingers corresponding to a position along said predetermined path where said nozzles are stopped, and means for moving the respective fingers toward and away from each other; and
    means for supplying a test current through said electric contact members.

5. The combination as claimed in claim 4 in which the component has flat contacts and flat sides, and the contacts surfaces of said electrical contact members and said rectifying fingers are flat.

6. The combination as claimed in claim 4 further comprising a nozzle rotating means at a further of said succession of stations for rotating a nozzle stopped at said further station to adjust the angle of the component carried on the nozzle.

7. The combination as claimed in claim 6 in which said predetermined path extends past said component mounting station to a reversing station, and said combination further comprising reversing means at said reversing station for rotating a nozzle stopped at said reversing station in a direction opposite to the direction it was rotated at said further station to the original position of the nozzle.

* * * * *